(12) United States Patent
Wollesen

(10) Patent No.: US 6,395,437 B1
(45) Date of Patent: May 28, 2002

(54) JUNCTION PROFILING USING A SCANNING VOLTAGE MICROGRAPH

(75) Inventor: Donald L. Wollesen, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 30 days.

(21) Appl. No.: 09/696,670

(22) Filed: Oct. 26, 2000

Related U.S. Application Data

(60) Provisional application No. 60/162,214, filed on Oct. 29, 1999.

(51) Int. Cl.[7] ................................................ G03F 9/00
(52) U.S. Cl. ........................................ 430/30; 382/145
(58) Field of Search ............................ 430/30; 382/145

(56) References Cited

U.S. PATENT DOCUMENTS 6,187,488 B1 * 2/2001 Hayasaki et al. ............. 430/30
6,331,368 B2 * 12/2001 Dirksen et al. ............... 430/30

* cited by examiner

*Primary Examiner*—Christopher G. Young

(57) ABSTRACT

A method is provided for obtaining an accurate image of a two-dimensional junction profile of a semiconductor device. Embodiments include sectioning a sample to be analyzed through the active transistor, either at a 90° angle to the planar surface or at a desired angle, as by a focused ion beam (FIB) apparatus. The sectioned transistor can be analyzed directly on the exposed silicon, or the exposed silicon of the cross-section can be passivated with a thin film material such as silicon dioxide, or with an undoped semiconductor material such as silicon or germanium. The electrodes (i.e., source, gate, drain and substrate electrodes) of the sample active transistor are then connected so they can be individually electrically biased. A direct current (DC) potential is imposed on an active region of the prepared sample, and a small alternating current (AC) potential is imposed on the DC potential. The active region is then scanned using a conventional atomic force micrograph (AFM) or scanning capacitance micrograph (SCM) tip as an AC signal detector to generate an accurate image of the active region.

20 Claims, 6 Drawing Sheets

JUNCTION PROFILING USING A SCANNING VOLTAGE MICROGRAPH

RELATED APPLICATIONS

This application claims priority from U.S. Provisional Patent Application Serial No. 60/162,214, filed on Oct. 29, 1999, entitled: "Voltage Contrast SEM Junction Profiling", the entire disclosure of which is hereby incorporated by reference herein.

This application contains subject matter similar to subject matter disclosed in copending U.S. patent applications: Ser. No. 09/696740, filed on Oct. 26, 2000.

FIELD OF THE INVENTION

The present invention relates to a method of analyzing a semiconductor device formed on a semiconductor substrate. The invention has particular applicability in analyzing junction profiles of semiconductor devices.

BACKGROUND ART

The measurement of junction depth of semiconductor devices is important for the design process. Transistor design is based on modeling and/or mathematical equations. These equations are based on physical properties, such as junction depth, or behavior. Historically, junction staining for one dimensional analysis was typically done by angle lapping and then staining the junction and measuring it. The staining process comprises applying a chemical etchant which will preferentially attack n+doped material or p+doped material, allowing the technician to delineate the location of the junction and measure its depth, etc.

Two dimensional junction depth measurement is necessary when submicron features are being formed, because many two dimensional electric field effects need to be accounted for. Various prior art chemical staining and Auger spectroscopy techniques have been used, but have definite limitations for submicron gate feature transistors.

Auger spectroscopy has "spot size" limitations and cannot deal with two-dimensional junction profiling. Auger spectroscopy is a form of scanning electron microscopy that analyzes spectra (i.e., energy) emitted from a surface, based on the principle that the energy emitted from a surface is indicative of the constituent material of the surface. The Auger equipment typically has a spot size of about one micron diameter and affects a depth typically several atoms or molecules thick. Thus, it cannot resolve the two dimensional junction profile of a junction depth smaller than one micron. This is problematic since junction depths are routinely on the order of one tenth of a micron. Auger spectroscopy has been successfully used for gross junction profiling where the specimen is angle lapped to yield accurate one dimensional information. However, it is not useful for performing two dimensional analysis.

Chemical staining is disadvantageous in that staining cannot be done in a depletion region since there are no free carriers. Thus, the depletion region edge does not coincide with the chemical junction edge. The chemical stain, which is an electrochemical activity, does not stain up to the junction. Therefore, actual junction depth cannot be measured, and erroneous results always occur. Furthermore, the longer the chemical etches the specimen, the deeper the junction becomes. In other words, the test affects the junction depth which is the object of measurement. Still further, the repeatability of this technique can be easily compromised if there is an error in the staining process.

Another problem with chemical staining relates to the fact that the stain is chemical doping, and the device operates because of activated doping. Thus, after chemical staining, doping is present that is not electrically active. Consequently, correct results cannot be achieved without performing additional, electrical measurements. Moreover, chemical staining does not reveal relative doping concentration, which is an extremely important parameter in transistor design. It will only detect the presence or absence of a dopant.

There exists a need for an effective methodology for accurately performing two dimensional junction profiling.

SUMMARY OF THE INVENTION

An advantage of the present invention is a method of obtaining an accurate image of a two-dimensional junction profile of a semiconductor device.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of inspecting a semiconductor device, the method comprising cross-sectioning the device to expose an active region to be inspected; imposing a direct current (DC) potential on the active region; imposing an alternating current (AC) potential on the DC potential; and scanning the active region with a scanning voltage micrograph (SVM) having an AC signal detector probe to generate an image of the active region.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1:
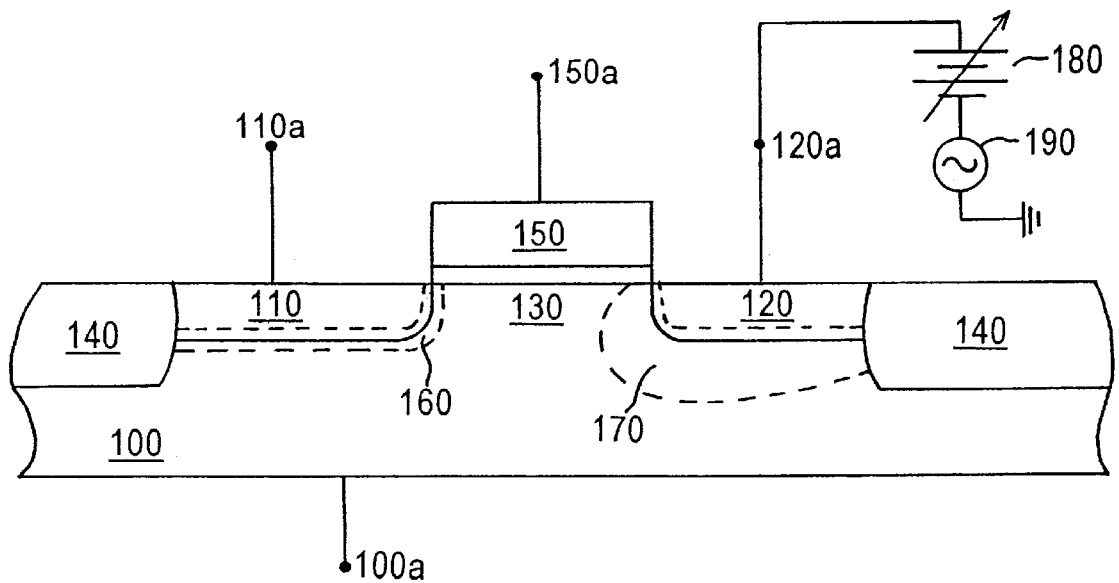
FIG. 1 schematically illustrates a cross-sectioned semiconductor device for use with the methodology of the present invention.

Conventional methodologies for profiling semiconductor junctions in two dimensions do not yield accurate results. The present invention addresses and solves these problems stemming from conventional junction profiling techniques.

The Atomic Force Micrograph (AFM) is a well-known micro-mechanical method of physical depth/height profiling of mechanical samples, such as semiconductor wafers, with accuracy down to angstroms. The well-known Scanning Capacitance Micrograph (SCM) is an extension and variant of the AFM. Whereas the AFM is a mechanical device using a fine tip, the SCM uses an electrically insulated tip to measure capacitance of the sample, such as a semiconductor wafer, or a piece of the sample. The present invention utilizes an SCM or AFM tip as an AC signal detector probe, thereby using the AFM or SCM as a "scanning voltage micrograph" (SVM). According to the methodology of the present invention, a device to be inspected is cross-sectioned to expose an active region to be inspected. A direct current (DC) potential is imposed on the active region, and a small alternating current (AC) potential is imposed on the direct current potential. The active region is then scanned using an AFM or SCM tip as an AC signal detector to obtain an accurate image of the active region in two dimensions.

The present invention will now be described in detail. The sample to be analyzed can be a standard test chip, or "technology development test chip", or can be a purpose-built chip. The sample is sectioned through the active transistor, either at a 90° angle to the planar surface or at a desired angle, as by a conventional focused ion beam (FIB) apparatus. Once sectioned, the transistor can be analyzed directly on the exposed silicon, or the exposed silicon of the cross-section can be passivated with a thin film material such as silicon dioxide by thermal oxidation or deposition, silicon nitride or other insulator by deposition, or with undoped semiconductor material such as carbon, silicon, or germanium by deposition.

The passivation layer is useful for making sure there is no surface contamination of the wafer due to exposure to oxygen in the air. Moreover, since the exposed edge of the sectioned device will behave differently than designed because it has been sectioned, it could be desirable to modify its behavior by applying a passivation layer of a different material. For example, the dielectric coefficient of silicon is about 11 and that of silicon dioxide is about 4. Therefore, a silicon nitride, amorphous carbon or silicon passivation layer having a dielectric coefficient of about 8 can be applied to match that of silicon.

The concern addressed by the choice of passivation layer is so-called "band bending" at the sectioned surface. When a device is sectioned, as to practice the present invention, the observed depletion spread is different than expected, because the dielectric coefficient in an air vacuum is different than that in bulk silicon. Thus, for a given applied potential, the change in the device's dielectric constant results in a depletion spread having different dimensions than the circuit designer intended, since the sectioned surface does not behave the same way as it does in the bulk silicon. This is disadvantageous because for modelling purposes the behavior of active areas in the bulk silicon are of greatest interest. Band bending is well known in the art, and can be calculated and compensated for using conventional techniques, and/or can be affected by the presence of a passivation layer. In other words, when practicing the present invention, the extent and effect of the band bending will depend on whether or not the silicon of the sectioned edge is left bare or coated with a thin film layer. Band bending will be discussed in greater detail below.

After sectioning, all of the electrodes of the sample active transistor to be analyzed are connected so they may be individually electrically biased when the sample is inspected according to the present invention. The device-under-test (DUT) fixturing is done so the AFM/SCM probe tip may be scanned along the cross-section surface. If the surface of the DUT is passivated with a thin insulator (e.g. $SiO_2$ or silicon nitride), an uncoated AFM tip may be used. An insulator-coated SCM tip may be used whether or not the DUT is passivated. To obtain the necessary electrical connections to its electrodes, the sectioned transistor can be packaged in a conventional way, or the device can be fixtured and the bonding pads on the die contacted with microprobes.

Referring now to FIG. 1, the sectioned device comprises substrate 100, source region 110, drain region 120, channel region 130, field oxide regions 140, and gate 150. Substrate electrode 100a is in electrical contact with substrate 100, source electrode 110a is in electrical contact with source 110, drain electrode 120a is in electrical contact with drain 120, and gate electrode 150a is in electrical contact with gate 150. In FIG. 1, depletion spreads 160 and 170 (between the dotted lines) are illustrated at source 110 and drain 120, respectively; source 110 showing the depletion spread 160 at zero volts bias. When practicing the present invention, an active or passive device element, such as drain 120, on the silicon substrate 100 is biased with a DC potential 180 to establish a depletion region. Superimposed on this DC potential is a "small signal" AC potential 190. Any frequency may be used for AC potential 190, from sub-audio to microwave.

Figure 2A:
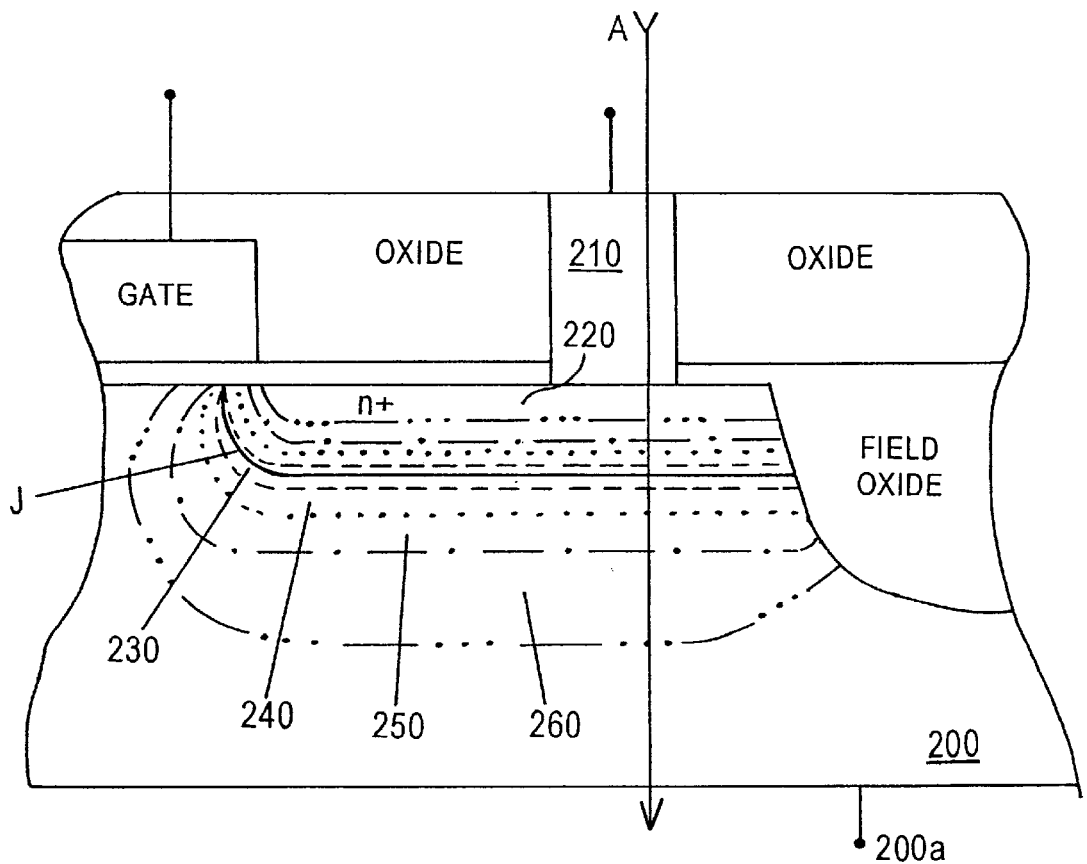
FIG. 2A schematically illustrates the methodology of an embodiment of the present invention.

Referring now to FIG. 2, in one embodiment of the present invention, the AFM/SCM tip (not shown) scans the sample (e.g. via a conventional mechanical raster scan), using the tip as an AC signal detector probe for two dimensional mapping of the device cross-section. The conventional AFM or SCM utilized in this manner will be referred to herein as an SVM. Referring now to FIG. 2A, arrow A runs down through the source/drain contact 210, the n+region 220 and through the various depletion spreads 230–260. Of course, only one of depletion spreads 230–260 will be present at any given time. As the AFM/SCM tip is scanned along arrow A's scan path, the result is a scan signal exhibiting a different response depending on the DC voltage applied to source/drain contact 210. If the scan is rastered (i.e., the path of arrow A repeated while successively moving to the right or left) while a voltage is applied to drain contact 210 and the scan signal response recorded, the result is a two dimensional representation of the depletion spread at a given DC voltage.

Figure 2C:
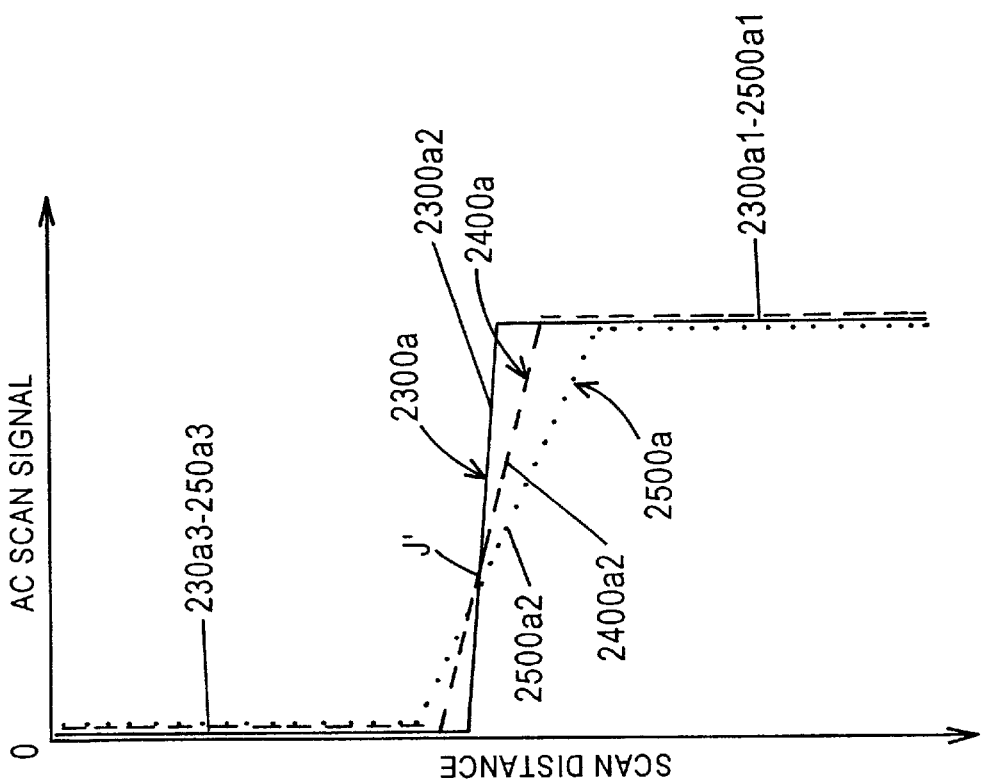
FIGS. 2B–2C graphically illustrate scanning voltage micrograph signals according to an embodiment of the present invention.
Figure 2B:
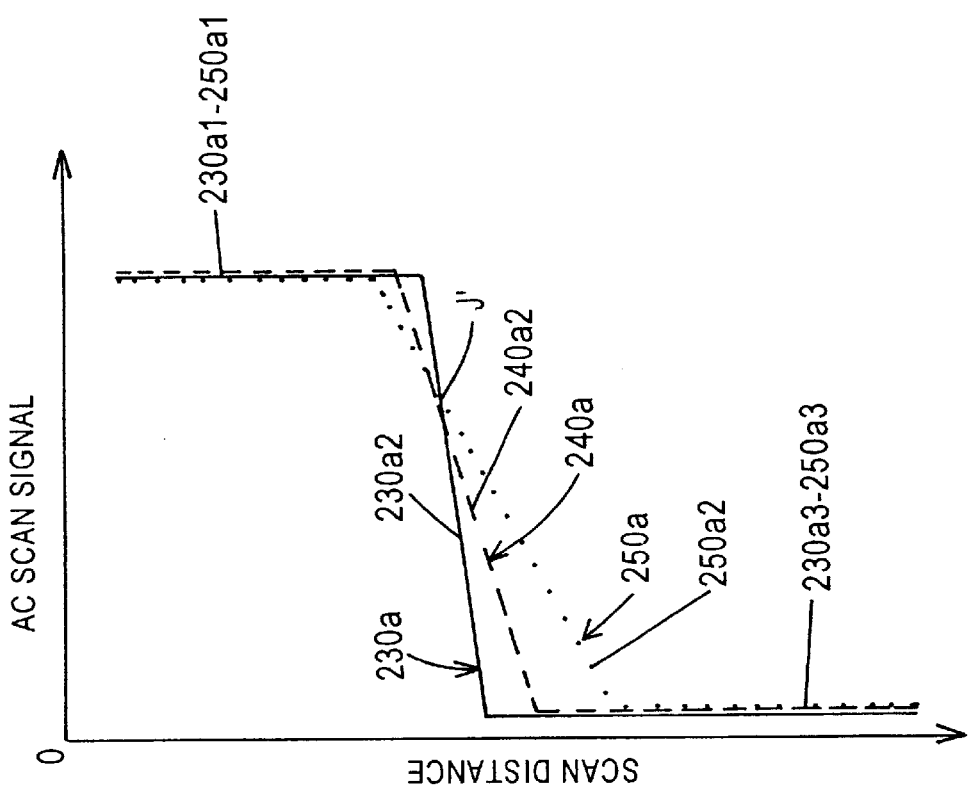

FIG. 2B graphically illustrates multiple raster scans along arrow A of the device of FIG. 2A, plotting scan signal strength (x-axis) versus scan distance (y-axis) of the probe as lines 230a–250a for several different DC voltages on drain contact 210 while an AC signal is applied to contact 210. When the DC voltage at contact 210 is set to zero (corresponding to depletion spread 230) and the device in FIG. 2A is scanned, the result is the line 230a of FIG. 2B. When the voltage at contact 210 is set to a low voltage (corresponding to depletion spread 240) and the device in FIG. 2A is scanned, the result is the line 240a of FIG. 2B. When the voltage at contact 210 is set to a medium voltage (corresponding to depletion spread 250) and the device in FIG. 2A is scanned, the result is the line 250a of FIG. 2B.

Referring again to FIGS. 2A and 2B, on the n+undepleted region 220 of FIG. 2A, the AC signal will be constant in level, as depicted by the vertical line segments 230a1–250a1. As the SVM probe traverses depletion region 230–250, the AC signal will diminish to the lower edge of the depletion spread, as depicted by the sloping line segments 230a2–350a2. In the undepleted substrate 200, no AC signal will be observed, as depicted by the vertical line segments 230a3–250a3. Thus, employing the present methodology one can determine how far depletion regions 240–260 extend up into n+region 220, and how far they extend down into substrate 200.

In an alternative embodiment of the present invention, the AC signal is applied to substrate 200 via the substrate electrode 200a, with n+region 220 positively biased (i.e., with a DC voltage) but at "AC ground." FIG. 2C graphically illustrates multiple raster scans of the device of FIG. 2A, plotting scan signal strength (x-axis) versus scan distance (y-axis) of the probe as lines 230a–250a for several different DC voltages on drain contact 210. When the DC voltage at contact 210 is set to zero (corresponding to depletion spread 230) and the device in FIG. 2A is scanned, the result is the line 2300a of FIG. 2C. When the voltage at contact 210 is set to a low voltage (corresponding to depletion spread 240) and the device in FIG. 2A is scanned, the result is the line 2400a of FIG. 2C. When the voltage at contact 210 is set to a medium voltage (corresponding to depletion spread 250) and the device in FIG. 2A is scanned, the result is the line 2500a of FIG. 2C.

Referring again to FIGS. 2A and 2C, in this case the scan signal from substrate 200 is constant (see segments 2300a1–2500a1), the AC signal diminishes traversing the depletion region 230–250 (see segments 2300a2–2500a2), and a zero AC signal occurs on undepleted n+region 220 (see segments 2300a3–2500a3).

When practicing the present invention as discussed above, the capacitance from the SVM probe tip to the sample is constant throughout the scan of n+region 220, then drops as depletion region 230–250 is scanned, since there are no carriers in the depletion region. As substrate 200's lighter doped material is scanned, the series resistance is higher, and the capacitance changes again. Thus, the scan signal changes as the depletion spread is scanned, as illustrated by each of curves 230a–250a in FIG. 2B, because the capacitance of depletion spreads 230–250 is relatively high compared to n+region 220 and substrate 200. Moreover, as the DC bias on contact 210 is changed, the resulting scan signal curve 230a–250a changes, as discussed above. The location of the chemical junction J (see FIG. 2A) can be approximated as the crossover point J' on FIGS. 2B and 2C of all the scan signal curves; that is, the "axis" about which the capacitance curves form.

Thus, a further advantage of the present invention is the determination of the crossover point J' that locates the approximate chemical junction. Crossover point J' is where the junction ends. A junction is typically defined as being where the number of n-type dopants is equal to the number of p-type dopants. In other words, at the junction J of n+region 220 of FIG. 2A, there is the same number of n+dopants as exist well below it in substrate 200. However, a large number of n+dopants are also located there. Junction J occurs where the doping count is equal. This can be seen in the plots of FIGS. 2B and 2C, but not with prior art junction staining. Even though conventional staining techniques may lead the chemist to think they are seeing the chemical junction, in reality they are not.

In copending U.S. application Ser. No. 09/696740, a method is disclosed wherein junction profiling is performed by sectioning a device, imposing a DC voltage on an active region, then imaging the active regions with a voltage contrast scanning electron microscope (SEM). The present invention and the methodology of the copending application are complementary. The SEM inspection methodology of the copending application can produce better spatial resolution under some circumstances than the scanning capacitance probe of the present invention. However, the scanning capacitance probe technique of the present invention yields results in a format that is easier to understand.

Moreover, signals expected from the voltage contrast SEM technique of the copending application are DC bias dependent, with zero signal at zero volts. However, this is not the case with the present methodology, wherein the AC signals are independent of DC bias. With the SVM of the present invention mechanically raster scanning the sample, an accurate two dimensional profile of the sample can be done at as many electrode bias conditions as desired, as illustrated in Table 1.

TABLE 1

| DUT Bias Conditions | | | |
|---|---|---|---|
| Source Bias | Gate Bias | Drain Bias | Substrate |
| 0 V | 0 V | 0 V | 0 V |
| 0 V | 0 V | 0.5 V | 0 V |
| 0 V | 0 V | 1.0 V | 0 V |
| 0 V | 0.5 V | 0 V | 0 V |
| 0 V | 1.0 V | 0 V | 0 V |
| 0 V | 0.5 V | 0.5 V | 0 V |
| 0 V | 1.0 V | 0.5 V | 0 V |
| 0 V | 0.5 V | 1.0 V | 0 V |
| 0 V | 1.0 V | 1.0 V | 0 V |
| 0 V | 0 V | 0 V | 0.5 V |
| 0 V | 0 V | 0.5 V | 0.5 V |

Once data is collected using the present methodology, computational corrections may be done per known doping profiles, insulator thicknesses, and DC voltages to account for band-bending at the sample surface as discussed below.

Additional information for analyzing depletion spread data can be obtained from conventional one dimensional doping profiles, normally obtained via the spreading resistance profile (SRP) method, secondary ion mass spectrometry (SIMS), or other methods. These conventional methods, although prone to error, provide a starting point for analysis. Several of these may be utilized along with the techniques of the present invention depending on the problem to be analyzed. Two dimensional computer analysis, such as "TCAD" analysis, may also be used to initially estimate the two dimensional doping profiles.

Figure 3A:
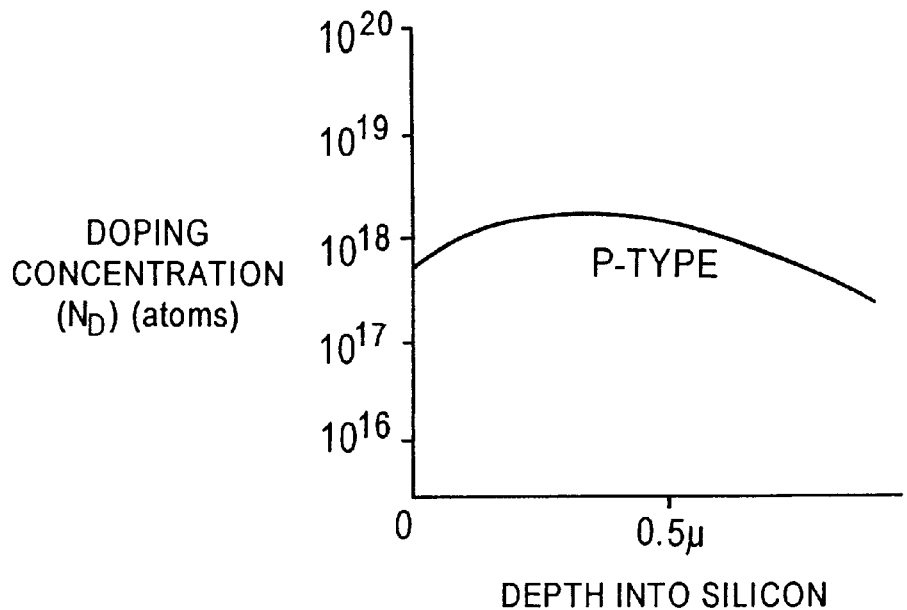
FIGS. 3A–3C graphically illustrate doping profiles employed when practicing the present invention.
Figure 3B:
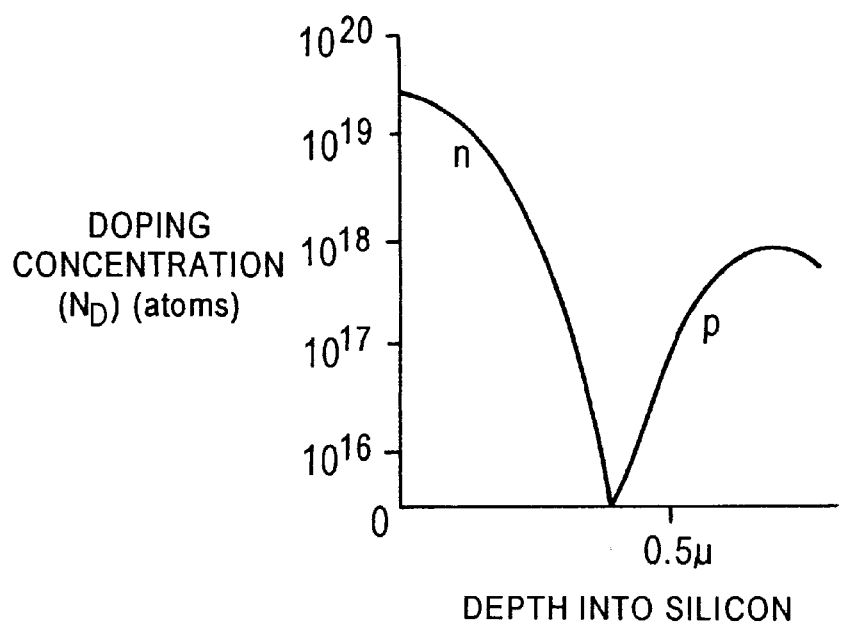
Figure 3C:
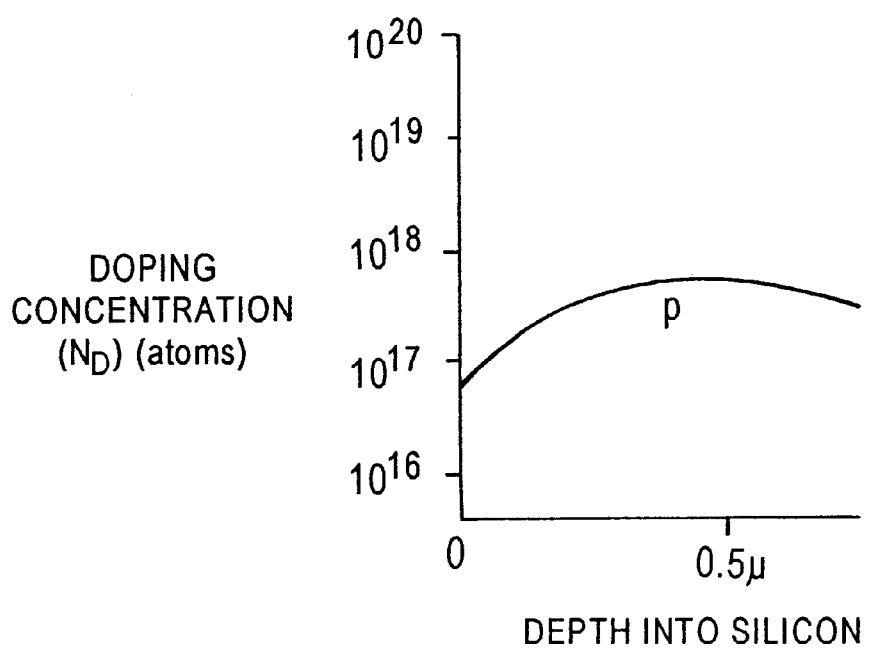
Figure 4A:
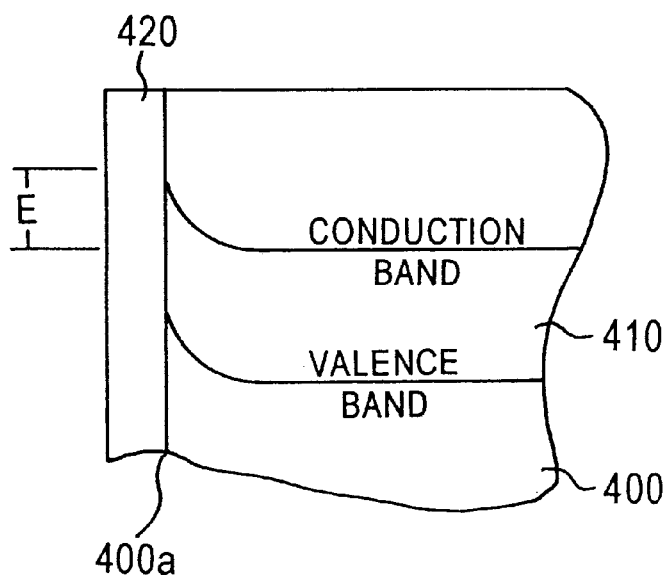
FIGS. 4A–4B graphically illustrate surface band-bending occurring when practicing the present invention.
Figure 4B:
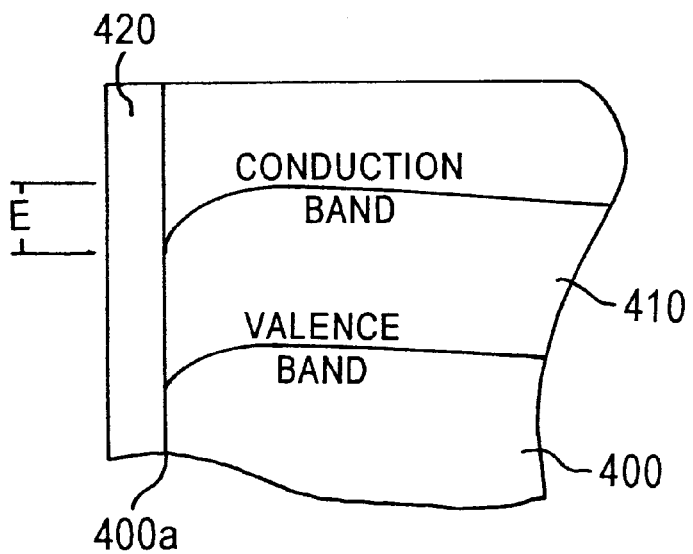

For example, FIGS. 3A–3C show exemplary doping profiles under the gate, under the n+source/drain region, and under the field oxide, respectively, of a typical transistor to be analyzed. As discussed above, a difficulty in sectioning through an active transistor and attempting to inspect depletion regions on the sample section is energy band-bending from bulk to surface. Band-bending is a function of surface states (e.g. silicon/silicon dioxide), charge trapping, and most importantly, the doping level. Band bending occurs least with high doping and occurs most at low doping, and creates errors which must be corrected for accurate junction depth measurement. When the doping levels are known, as shown in FIGS. 3A–C, computational correction can be accurately performed. FIGS. 4A and 4B illustrate band-bending in sectioned n-type and p-type semiconductor devices, respectively, which will create errors of surface depletion spreads correctable by computation. As shown in FIGS. 4A and 4B, the shape of the depletion spread 410 distorts proximal to the sectioned edge 400*a* of substrate 400, which is shown with a thin film passivation layer 420 applied, such as an oxide layer. The error in the conduction band to be corrected for using conventional techniques is shown as reference character "E". Well-known SRP measurements require the same type of computational correction. Knowledge of the doping profile (as in FIGS. 3A–C) is helpful for greater accuracy when practicing the present invention, but not absolutely necessary.

Figure 5A:
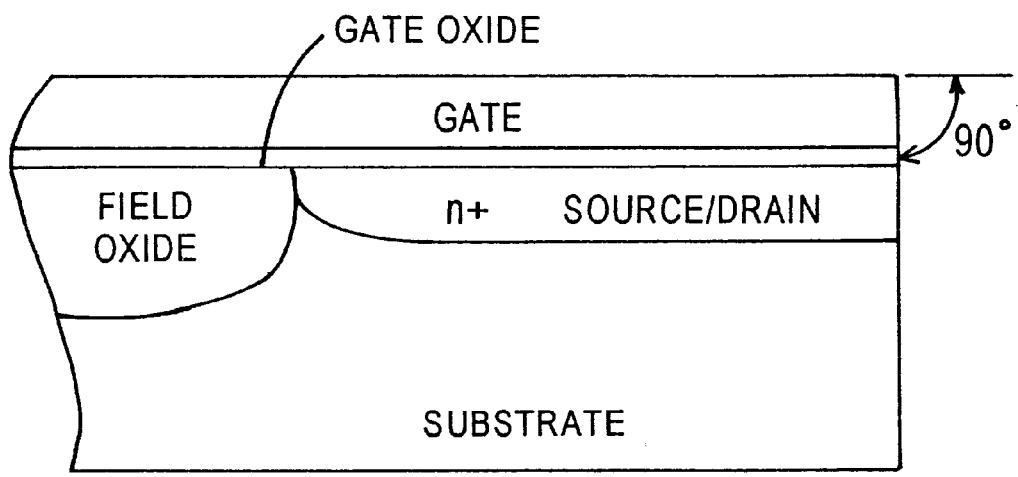
FIGS. 5A–5B schematically illustrate alternate embodiments of the present invention.
Figure 5B:
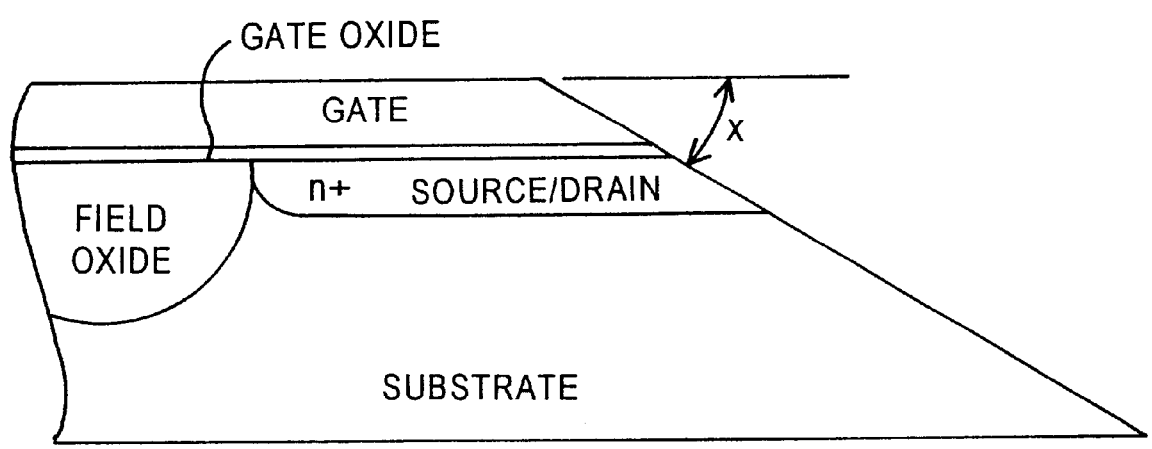

In another embodiment of the present invention, resolution enhancement is accomplished through the geometry of the cross-section of the inspected device. Although a 90° angle section as shown in FIG. 5A is most common, using a shallower angle x for the sample section, as shown in FIG. 5B, can improve junction depth resolution with the inventive SVM techniques by mitigating band-bending effects. The shallower the angle, the greater the depletion spread resolution. Band-bending on angled surfaces is different than on 90° angled samples, but this can be included in computational corrections similar to conventional techniques for correction of SRP measurements that use various lap angles for sample preparation.

SVM data collected by the techniques of the present invention can resolve less than 100 Å spatial resolution, which enables substantial improvements in depletion spread measurements and doping profiles in two dimensions at any reasonable DUT bias, as well as very accurate identification of the chemical junction. In this way, the present invention greatly improves device understanding of sub-micron transistors and other devices, thereby enabling better calibration of TCAD simulation tools for both process and device simulation.

The present invention is applicable to the inspection and analysis of various types of semiconductor devices, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of inspecting a semiconductor device, the method comprising:

cross-sectioning the device to expose an active region to be inspected;

imposing a direct current (DC) potential on the active region;

imposing an alternating current (AC) potential on the DC potential; and scanning the active region with a scanning voltage micrograph (SVM) having an AC signal detector probe to generate an image of the active region.

2. The method of claim 1, comprising sectioning the device at an angle of about 90 degrees.

3. The method of claim 1, comprising sectioning the device at an angle shallower than 90 degrees.

4. The method of claim 1, comprising sectioning the device using a focused ion beam apparatus.

5. The method of claim 1, comprising forming a passivation layer on the exposed active region.

6. The method of claim 5, wherein the passivation layer comprises an insulating material.

7. The method of claim 6, wherein the passivation layer comprises silicon dioxide formed by thermal oxidation or deposition.

8. The method of claim 6, wherein the passivation layer comprises silicon nitride.

9. The method of claim 5, wherein the passivation layer comprises an undoped semiconductor material.

10. The method of claim 9, wherein the passivation layer comprises carbon, silicon or germanium.

11. The method of claim 1, wherein the active region comprises a pair of source/drain regions each having an electrical contact, and the sectioned device further comprises a gate having an electrical contact and a substrate having an electrical contact, the method comprising packaging the device such that each of the source/drain contacts, the gate contact and the substrate contact can be selectively electrically connected to the power source.

12. The method of claim 1, wherein the active region comprises a pair of source/drain regions each having an electrical contact, and the sectioned device further comprises a gate having an electrical contact and a substrate having an electrical contact, the method comprising fixturing the device such that each of the source/drain contacts, the gate contact and the substrate contact can be selectively electrically connected to the power source.

13. The method of claim 1, comprising biasing the active region with the DC potential to generate a depletion spread, biasing the active region with the AC potential, and imaging the depletion spread with the SVM.

14. The method of claim 1, wherein the sectioned device comprises a semiconductor substrate having an electrical contact, the method comprising biasing the active region with the DC potential to generate a depletion spread, biasing the substrate with the AC potential, and imaging the depletion spread with the SVM.

15. The method of claim 1, wherein the scanning step includes raster scanning the active region with the AC signal detector probe.

16. The method of claim 15, wherein the SVM generates an AC scan signal strength during the raster scan, and the raster scan is conducted over a scan distance, the method comprising:

biasing the active region with a first DC potential to generate a first depletion spread;

performing a first raster scan of the active region; and generating a graphical representation of the AC scan signal strength versus the scan distance for the first raster scan.

17. The method of claim 16, comprising:

biasing the active region with a second DC potential different from the first DC potential to generate a second depletion spread;

performing a second raster scan of the active region; and generating a graphical representation of the AC scan signal strength versus the scan distance for the second raster scan.

18. The method of claim 5, comprising forming the passivation layer such that the effects of band bending are reduced.

19. The method of claim 1, comprising compensating for the effects of band bending prior to generating the image of the active region.

20. The method of claim 1, wherein the SVM comprises an atomic force micrograph or a scanning capacitance micrograph, and the AC signal detector probe comprises an atomic force micrograph tip or a scanning capacitance micrograph tip, respectively.

* * * * *

UNITED STATES PATENT AND TRADEMARK OFFICE
CERTIFICATE OF CORRECTION

PATENT NO.      : 6,395,437 B1
DATED           : May 28, 2002
INVENTOR(S)     : Wollesen et al.

It is certified that error appears in the above-identified patent and that said Letters Patent is hereby corrected as shown below:

<u>Title page,</u>
Item [*] Notice, "Subject to any disclaimer, the term of this patent is extended or adjusted under 35 USC 154(b) by (30) days", delete the phrase "by 392 days" and insert -- by 0 days --

Signed and Sealed this

Fourteenth Day of October, 2003

JAMES E. ROGAN
*Director of the United States Patent and Trademark Office*